(12) United States Patent
Lee et al.

(10) Patent No.: US 12,058,888 B2
(45) Date of Patent: Aug. 6, 2024

(54) DISPLAY DEVICE HAVING POLYCRYSTALLINE SILICON LAYER

(71) Applicant: Samsung Display Co., Ltd., Yongin-si (KR)

(72) Inventors: Dong-Sung Lee, Hwaseong-si (KR); Seo Jong Oh, Seoul (KR); Byung Soo So, Yongin-si (KR); Dong-min Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/503,358

(22) Filed: Oct. 18, 2021

(65) Prior Publication Data

US 2022/0102447 A1 Mar. 31, 2022

Related U.S. Application Data

(62) Division of application No. 16/679,656, filed on Nov. 11, 2019, now Pat. No. 11,164,919.

(30) Foreign Application Priority Data

Nov. 19, 2018 (KR) ........................ 10-2018-0142225

(51) Int. Cl.
*H10K 59/12* (2023.01)
*H01L 21/02* (2006.01)
(Continued)

(52) U.S. Cl.
CPC ....... *H10K 59/12* (2023.02); *H01L 21/02057* (2013.01); *H01L 21/02532* (2013.01);
(Continued)

(58) Field of Classification Search
CPC ............ H01L 29/66757; H01L 29/786; H01L 29/78675; H01L 21/02052; H01L 29/4908;
(Continued)

(56) References Cited

U.S. PATENT DOCUMENTS

| 4,775,488 A | 10/1988 | Hintermeier et al. |
| 10,411,133 B2 | 9/2019 | Seo et al. |

(Continued)

FOREIGN PATENT DOCUMENTS

| JP | 1994-104192 | 12/1994 |
| JP | 2002-237600 | 8/2002 |

(Continued)

OTHER PUBLICATIONS

Non-Final Office Action dated Mar. 17, 2021, in U.S. Appl. No. 16/679,656.

(Continued)

*Primary Examiner* — Changhyun Yi
(74) *Attorney, Agent, or Firm* — KILE PARK REED & HOUTTEMAN PLLC

(57) ABSTRACT

A method of manufacturing a polycrystalline silicon layer for a display device includes the steps of forming an amorphous silicon layer on a substrate, cleaning the amorphous silicon layer with hydrofluoric acid, rinsing the amorphous silicon layer with hydrogenated deionized water, and irradiating the amorphous silicon layer with a laser beam to form a polycrystalline silicon layer.

8 Claims, 14 Drawing Sheets

(51) Int. Cl.
*H01L 29/66* (2006.01)
*H01L 29/786* (2006.01)

(52) U.S. Cl.
CPC .. *H01L 21/02592* (2013.01); *H01L 21/02675* (2013.01); *H01L 29/66757* (2013.01); *H01L 29/78675* (2013.01)

(58) Field of Classification Search
CPC ......... H01L 21/26506; H01L 29/66492; H01L 21/02057; H01L 21/02532; H01L 21/02592; H01L 21/02675; H01L 21/32055; H01L 21/02043; H10K 59/12
See application file for complete search history.

(56) References Cited

U.S. PATENT DOCUMENTS

| | | | |
|---|---|---|---|
| 2001/0023092 | A1 | 9/2001 | Ohtani et al. |
| 2002/0036289 | A1* | 3/2002 | Tamura ................. G02F 1/1368 257/66 |
| 2004/0042307 | A1 | 3/2004 | Ohmi et al. |
| 2005/0181566 | A1 | 8/2005 | Machida et al. |
| 2005/0202612 | A1* | 9/2005 | Tamura ............. H01L 29/78675 438/166 |
| 2006/0114209 | A1 | 6/2006 | Kim et al. |
| 2009/0121231 | A1* | 5/2009 | Kim .................. H01L 29/66742 438/166 |
| 2009/0159879 | A1* | 6/2009 | Jeong .................. H01L 29/7869 257/E33.013 |
| 2011/0300674 | A1 | 12/2011 | Chung et al. |
| 2012/0088346 | A1 | 4/2012 | Lee |
| 2015/0159300 | A1* | 6/2015 | Cho ..................... B23K 26/361 219/121.68 |
| 2020/0303424 | A1 | 9/2020 | Lee et al. |
| 2020/0381480 | A1 | 12/2020 | Reznicek et al. |
| 2020/0388662 | A1 | 12/2020 | Tian et al. |

FOREIGN PATENT DOCUMENTS

| | | |
|---|---|---|
| JP | 6104192 | 3/2017 |
| KR | 10-0297318 | 11/2001 |
| KR | 10-2002-0024514 | 3/2002 |
| KR | 10-2006-0058987 | 6/2006 |
| KR | 10-2008-0056956 | 6/2008 |
| KR | 10-2011-0132808 | 12/2011 |
| KR | 10-2012-0073371 | 7/2012 |
| KR | 10-2015-0065391 | 6/2015 |
| KR | 10-2017-0059502 | 5/2017 |
| KR | 10-2019-0038729 | 4/2019 |

OTHER PUBLICATIONS

Notice of Allowance dated Jun. 29, 2021, in U.S. Appl. No. 16/679,656.
Office Action issued from the Korean Patent Office on Oct. 5, 2023 for Korean Patent Application No. 10-2018-0142225.
Chinese Office Action dated Jan. 26, 2024, in Chinese Patent Application No. 201911112877.9 (with English translation).
Korean Office Action with Englishh translation for Korean Patent Applcation No. 10-2018-0142225, dated May 21, 2024.

* cited by examiner

DISPLAY DEVICE HAVING POLYCRYSTALLINE SILICON LAYER

CROSS-REFERENCE TO RELATED APPLICATION(S)

This application is a Divisional of U.S. patent application Ser. No. 16/679,656, filed on Nov. 11, 2019, which claims priority from and the benefit of Korean Patent Application No. 10-2018-0142225 filed on Nov. 19, 2018 which is hereby incorporated by reference for all purposes as if fully set forth herein.

BACKGROUND

Field

Exemplary implementations of the invention relate generally to a method of manufacturing substrates for display devices and, more specifically, to a method of manufacturing substrates having a polycrystalline silicon layer, a display device using the method, and a method of manufacturing a display device.

Discussion of the Background

An active matrix (AM) type organic light emitting display device may include a pixel circuit in each pixel and the pixel circuit may include a thin film transistor (TFT) using silicon. The TFT may be formed of amorphous silicon or polycrystalline silicon.

Since an active layer having a source, a drain, and a channel is formed of amorphous silicon (a-Si), an a-Si TFT used in the pixel circuit may have a low electron mobility of 1 cm2/Vs or less. Therefore, the a-Si TFT has been recently replaced with polycrystalline silicon (poly-Si) TFT. The poly-Si TFT has higher electron mobility and a safer light illumination than the a-Si TFT. Therefore, the poly-Si TFT may be appropriate to be used as an active layer of a driving TFT and/or a switching TFT of the AM type organic light emitting display device.

The poly-Si may be manufactured according to several methods. These methods may be generally classified as either a method of depositing poly-Si or a method of depositing and crystallizing a-Si.

Examples of the method of depositing the poly-Si include chemical vapor deposition (CVD), sputtering, vacuum evaporation, etc.

Examples of the method of depositing and crystallizing the a-Si include solid phase crystallization (SPC), excimer laser crystallization (ELC), metal induced crystallization (MIC), metal induced lateral crystallization (MILC), sequential lateral solidification (SLS), etc.

The above information disclosed in this Background section is only for understanding of the background of the inventive concepts, and, therefore, it may contain information that does not constitute prior art.

SUMMARY

Methods of manufacturing a polycrystalline silicon layer constructed according to the principles and exemplary implementations of the invention are capable of decreasing the surface roughness of a polycrystalline silicon layer. For example, in the method of manufacturing the polycrystalline silicon layer according to some exemplary embodiments of the invention, before crystallizing the amorphous silicon layer to form the polycrystalline silicon layer, the amorphous silicon layer may be cleaned with hydrofluoric acid and rinsed with the hydrogenated deionized water, to decrease the surface roughness of the polycrystalline silicon layer to create a more planar surface.

Further, display devices constructed according to the principles and exemplary implementations of the invention and methods of manufacturing the same are capable of decreasing the surface roughness of an active pattern in a thin film transistor (TFT). Since the display device according to the exemplary embodiments includes the TFT with the active pattern having a low surface roughness, the threshold voltage of the TFT may be more uniform, and the gate insulation layer disposed on the active pattern may be protected from damage.

Additional features of the inventive concepts will be set forth in the description which follows, and in part will be apparent from the description, or may be learned by practice of the inventive concepts.

According to one aspect of the invention, a method of manufacturing a polycrystalline silicon layer for a display device includes the steps of forming an amorphous silicon layer on a substrate, cleaning the amorphous silicon layer with hydrofluoric acid, rinsing the amorphous silicon layer with hydrogenated deionized water, and irradiating the amorphous silicon layer with a laser beam to form a polycrystalline silicon layer.

The hydrofluoric acid may include a hydrogen fluoride in an amount of about 0.5%.

The amorphous silicon layer may be cleaned for about 40 seconds to about 54 seconds.

A natural oxide layer may be formed on the amorphous silicon layer during the step of forming the amorphous silicon layer, and the natural oxide layer may be removed during the step of cleaning the amorphous silicon layer.

The hydrogenated deionized water may have a hydrogen concentration of about 1.0 ppm.

The laser beam may have an energy density of in a range of about 450 mJ/cm2 to about 500 mJ/cm2.

The width of the laser beam may be about 480 μm, and the scan pitch of the laser beam may be in a range of about 9 μm to about 30 μm.

The polycrystalline silicon layer may have surface roughness with a root-mean-square (RMS) value of about 4 nm or less.

A protrusion may be formed on a surface of the polycrystalline silicon layer after the step of forming the polycrystalline silicon layer, and the protrusion may have a sharp-pointed tip.

The polycrystalline silicon layer may have a grain size in a range of about 150 nm to about 200 nm.

The polycrystalline silicon layer may have grains that are randomly arranged.

The method may further include the step of forming a buffer layer on the substrate before forming the amorphous silicon layer.

According to another aspect of the invention, a display device includes a substrate, a thin film transistor disposed on the substrate, and a display element disposed on the thin film transistor. The thin film transistor may include an active pattern disposed on the substrate, the active pattern having a surface roughness with a root-mean-square (RMS) value of about 4 nm or less, a gate insulation layer disposed on the active pattern, and a gate electrode disposed on the gate insulation layer.

A protrusion may be formed on a surface of the active pattern, and the protrusion may have a sharp-pointed tip.

The active pattern may have a grain size in a range of about 150 nm to about 200 nm.

The active pattern may include randomly arranged grains.

The active pattern may include a source region, a drain region, and a channel region formed between the source region and the drain region.

The gate electrode may overlap the channel region of the active pattern.

The thin film transistor may further include a source electrode and a drain electrode disposed on the gate electrode, the source electrode and the drain electrode being respectively electrically connected to the source region and the drain region of the active pattern.

The display element may include a first electrode electrically connected to the thin film transistor, an emission layer disposed on the first electrode, and a second electrode disposed on the emission layer.

According to still another aspect of the invention, a method of manufacturing a display device includes the steps of forming an amorphous silicon layer on a substrate, cleaning the amorphous silicon layer with hydrofluoric acid, rinsing the amorphous silicon layer with hydrogenated deionized water, irradiating the amorphous silicon layer with a laser beam to form a polycrystalline silicon layer, etching the polycrystalline silicon layer to form a polycrystalline silicon pattern, forming a gate insulation layer on the polycrystalline silicon pattern, forming a gate electrode on the gate insulation layer, injecting an ion at a portion of the polycrystalline silicon pattern to form an active pattern, and forming a display element on the gate electrode.

The hydrofluoric acid may include hydrogen fluoride in an amount of about 0.5%.

The step of cleaning the amorphous silicon layer may include cleaning for about 40 seconds to about 54 seconds.

The step of rinsing the amorphous silicon layer with hydrogenated deionized water may include rinsing with hydrogenated deionized water having a hydrogen concentration of about 1.0 ppm.

The step of irradiating the amorphous silicon layer with a laser beam may have include irradiating with a laser beam having an energy density in a range of about 450 mJ/cm2 to about 500 mJ/cm2.

The method may further include the step of forming a source electrode and a drain electrode on the gate electrode, the source electrode and the drain electrode being electrically connected to the active pattern.

The step of forming the display element may include the steps of forming a first electrode on the gate electrode, the first electrode being electrically connected to the active pattern, forming an emission layer on the first electrode, and forming a second electrode on the emission layer.

In the method of manufacturing the display device according to one or more embodiments, before crystallizing the amorphous silicon layer to form the active pattern, the amorphous silicon layer may be cleaned with the hydrofluoric acid and rinsed with the hydrogenated deionized water, which decreases the surface roughness of the active pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
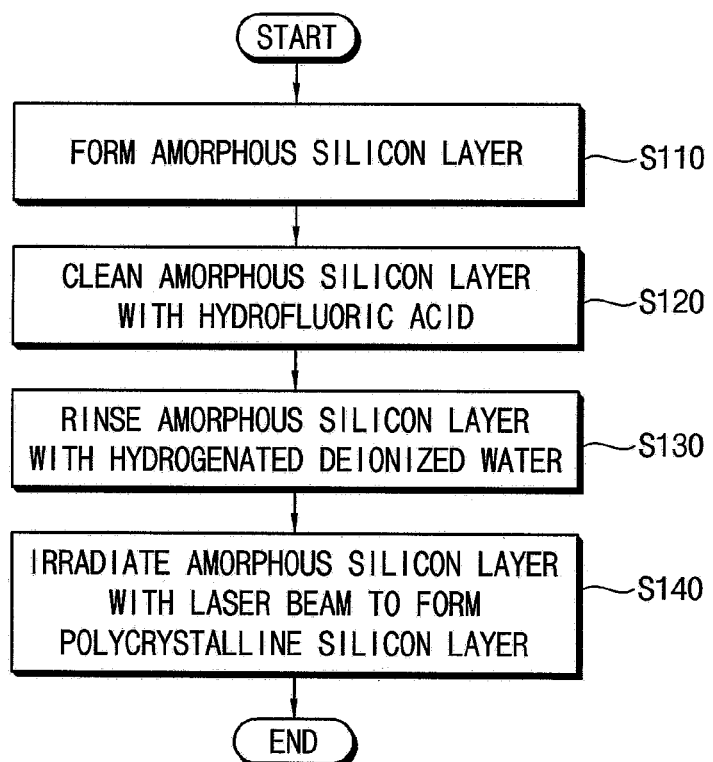
FIG. 1 is a flowchart illustrating a method of manufacturing a polycrystalline silicon layer according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, methods of manufacturing polycrystalline silicon layers, thin film transistor substrates and methods of manufacturing the thin film transistor substrates, and display devices and methods of manufacturing the display devices in accordance with exemplary embodiments will be explained in detail with reference to the accompanying drawings.

Hereinafter, a method of manufacturing a polycrystalline silicon layer according to an exemplary embodiment will be described with reference to FIGS. 1 to 7.

FIG. 1 is a flowchart illustrating a method of manufacturing a polycrystalline silicon layer according to the principles of the invention. FIGS. 2, 3, 4, and 6 are cross-sectional views and FIG. 5 is a perspective view illustrating a method of manufacturing a polycrystalline silicon layer according to the principles of the invention.

Figure 2:
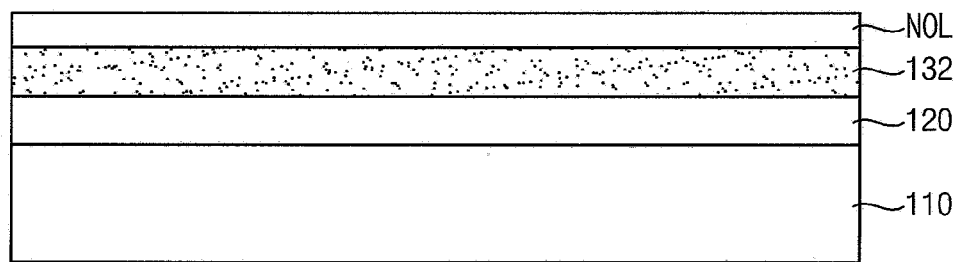
FIGS. 2, 3, 4, and 6 are cross-sectional views

Referring to FIGS. 1 and 2, an amorphous silicon layer 132 may be formed on a substrate 110 (S110).

The substrate 110 may be an insulating substrate including glass, quartz, ceramic, etc. In an exemplary embodiment, the substrate 110 may be an insulating flexible substrate including plastic such as polyethylene terephthalate (PET), polyethylene naphthalate (PEN), polyether ether ketone (PEEK), polycarbonate (PC), polyarylate, polyether sulfone (PES), polyimide (PI), etc.

A buffer layer 120 may be formed on the substrate 110. The buffer layer 120 may provide a planarized surface above the substrate 110. The buffer layer 120 may prevent impurities from permeating above the substrate 110 through the substrate 110. For example, the buffer layer 120 may be formed of silicon oxide, silicon nitride, etc.

The amorphous silicon layer 132 may be formed on the buffer layer 120. The amorphous silicon layer 132 may be formed by methods such as low pressure chemical vapor deposition (LPCVD), atmospheric pressure chemical vapor deposition (APCVD), plasma enhanced chemical vapor deposition (PECVD), sputtering, vacuum evaporation, etc.

A natural oxide layer NOL may be formed on the amorphous silicon layer 132. The natural oxide layer NOL may be formed when an upper portion of the amorphous silicon layer 132 is exposed to air. When the natural oxide layer NOL remains on the amorphous silicon layer 132, a protrusion that has a relatively large thickness may be formed on a surface of a polycrystalline silicon layer by the natural oxide layer NOL in a subsequent process for crystallizing the amorphous silicon layer 132 to form the polycrystalline silicon layer.

Figure 3:
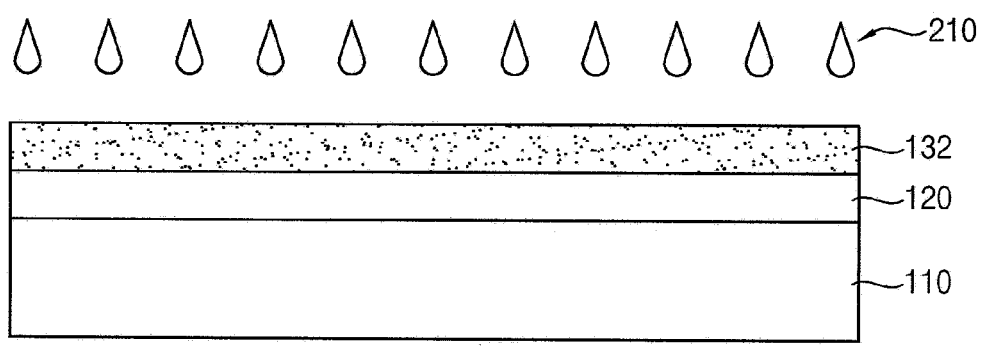

Referring to FIGS. 1 and 3, the amorphous silicon layer 132 may be cleaned (S120).

The amorphous silicon layer 132 may be cleaned using a hydrofluoric acid 210. The hydrofluoric acid 210 may be an aqueous solution in which a hydrogen fluoride (HF) dissolves. For example, the hydrofluoric acid 210 may include the hydrogen fluoride in an amount of about 0.5%. The amorphous silicon layer 132 may be cleaned by the hydrofluoric acid 210 to remove the natural oxide layer NOL formed on the amorphous silicon layer 132.

In an exemplary embodiment, the amorphous silicon layer 132 may be cleaned for about 40 seconds to about 54 seconds. If the amorphous silicon layer 132 is cleaned for less than about 40 seconds, the natural oxide layer NOL formed on the amorphous silicon layer 132 may not be removed enough. If the amorphous silicon layer 132 is cleaned for greater than about 54 seconds, the amorphous silicon layer 132 may be affected by the hydrofluoric acid 210.

Figure 4:
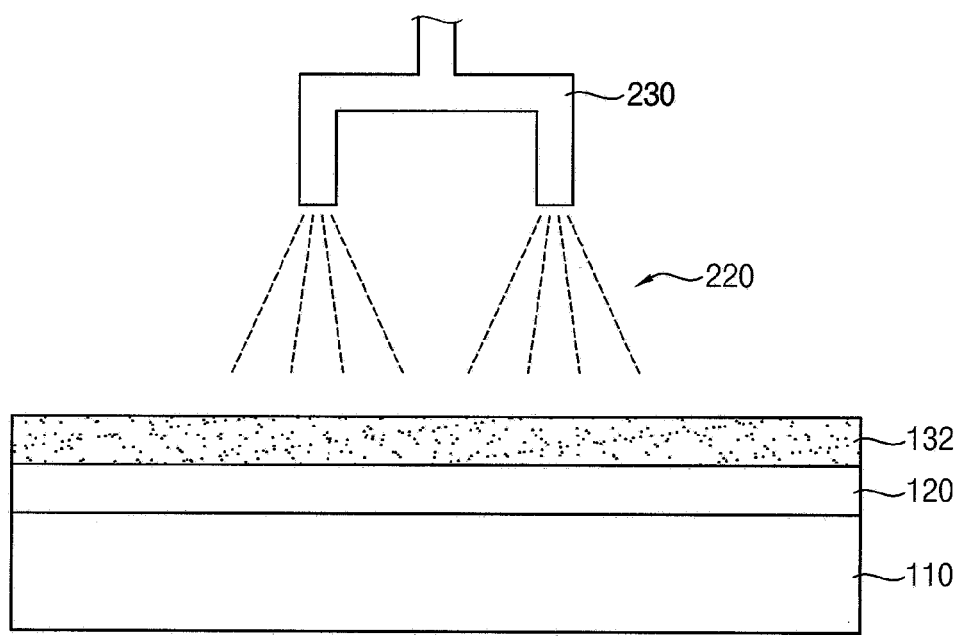
Figure 5:
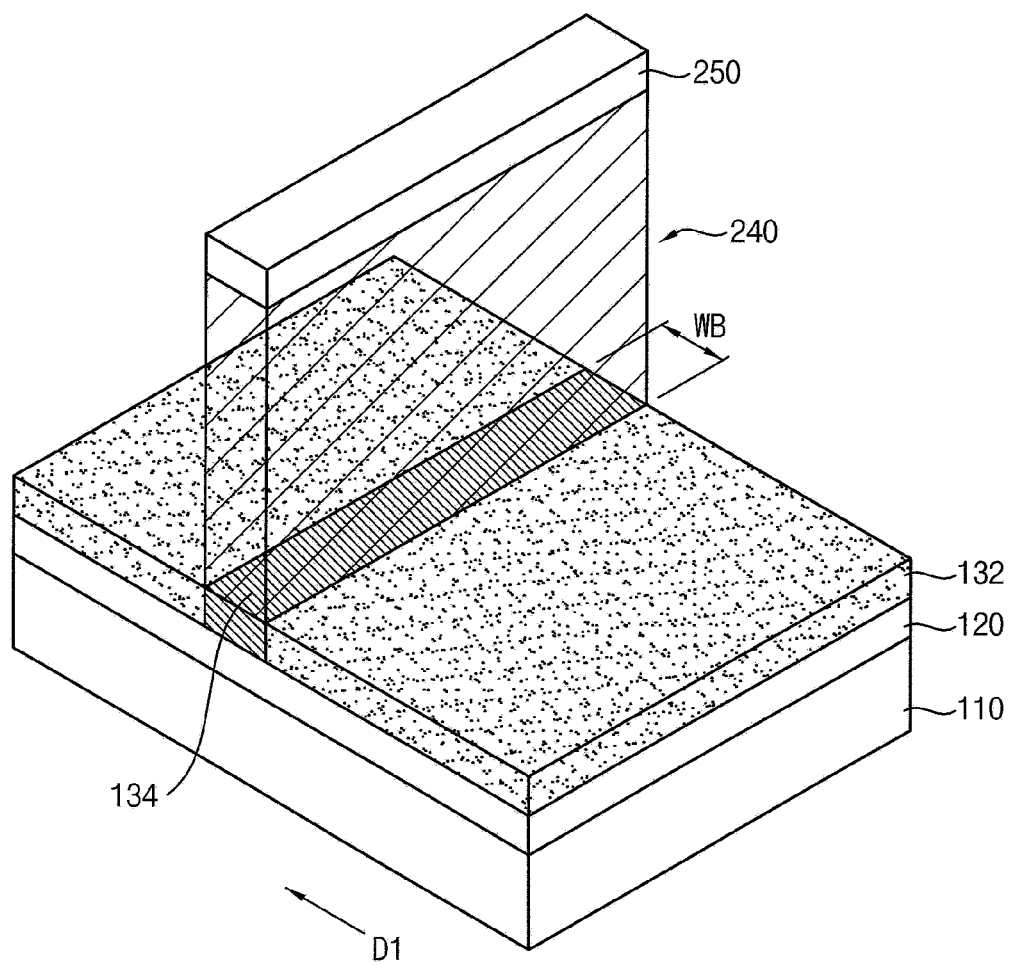
FIG. 5 is a perspective view illustrating a method of manufacturing a polycrystalline silicon layer according to the principles of the invention.

Referring to FIGS. 1 and 4, the amorphous silicon layer 132 may be rinsed (S130).

The amorphous silicon layer 132 may be rinsed using a hydrogenated deionized water 220. For example, a hydrogen concentration of the hydrogenated deionized water 220 may be about 1.0 ppm. For example, the hydrogenated deionized water 220 may be supplied to the amorphous silicon layer 132 via a spray 230 with moving the substrate 110 disposed under the spray 230 that is fixed. The hydrofluoric acid 210 that remains on the amorphous silicon layer 132 may be removed by rinsing the amorphous silicon layer 132 with the hydrogenated deionized water 220.

If the amorphous silicon layer 132 is rinsed with a dehydrogenated deionized water, oxygen in the deionized water may remain on the amorphous silicon layer 132, and may be visible as a circular defect due to the oxygen after a crystallization process. However, in the illustrated embodiment, the amorphous silicon layer 132 may be rinsed with the hydrogenated deionized water 220 thereby preventing the circular defect from being visible.

Figure 6:
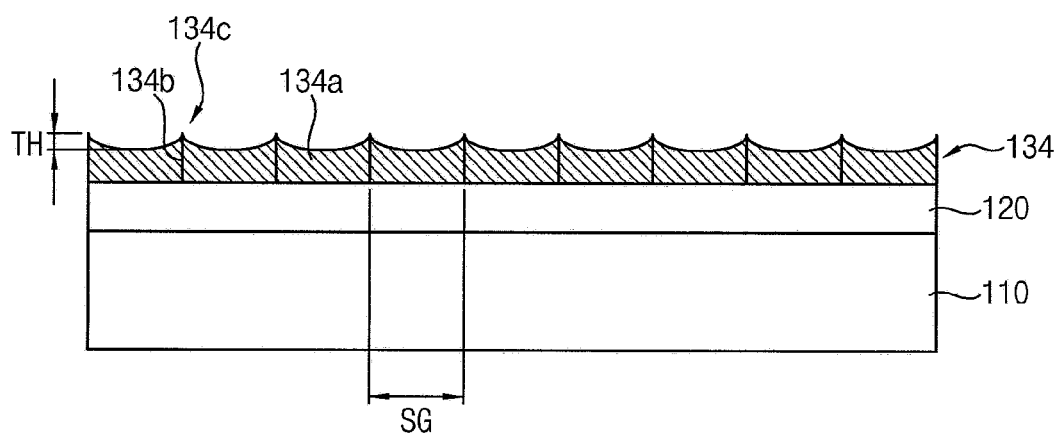

Referring to FIGS. 1, 5, and 6, a polycrystalline silicon layer 134 may be formed.

The polycrystalline silicon layer 134 may be formed by irradiating the amorphous silicon layer 132 with a laser beam 240. A laser 250 may intermittently generate the laser beam 240 to irradiate the amorphous silicon layer 132. For example, the laser 250 may be an excimer laser for generating the laser beam 240 with a relatively short wavelength, at relatively high power, and relatively high efficiency. The excimer laser may include, for example, an inert gas, an inert gas halide, a mercury halide, an inert gas acid compound, and a polyatomic excimer. Examples of the inert gas are Ar2, Kr2, and Xe2. Examples of the inert gas halide are ArF, ArCl, KrF, KrCl, XeF, and XeCl. Examples of the mercury halide are HgCl, HgBr, and HgI. Examples of the inert gas acid compound are ArO, KrO, and XeO. Examples of the polyatomic excimer are Kr2F, and Xe2F.

The amorphous silicon layer 132 may be crystallized into the polycrystalline silicon layer 134 by irradiating the amorphous silicon layer 132 with the laser beam 240 emitted from the laser 250 with moving the substrate 110 along a first direction D1. The laser 250 may irradiate the amorphous silicon layer 132 with the laser beam 240 having an energy density in a range of about 450 mJ/cm2 to about 500 mJ/cm2. In an exemplary embodiment, the width WB of the laser beam 240 in the first direction D1 may be about 480 µm, and the scan pitch of the laser beam 240 in the first direction D1 may be in a range of about 9 µm to about 30 µm. For example, the laser beam 240 may be irradiated to a predetermined region of the amorphous silicon layer 132 about 24 times when the scan pitch is about 24 µm. As shown in FIG. 5, the region in which the crystallization process is performed using the laser beam 240 may be converted into the polycrystalline silicon layer 134 from the amorphous silicon layer 132.

When the laser beam 240 is irradiated on the amorphous silicon layer 132 in a solid state, the amorphous silicon layer 132 may absorb heat and change into a liquid state. Then, the amorphous silicon layer 132 may release the heat and change into the solid state again. In this case, a crystal may grow from a crystal seed, and a grain 134a may be formed. When there is a difference in cooling rate in the amorphous silicon layer 132 in the course of changing from the liquid state to the solid state, since the grain 134a grows from a region having a high cooling rate toward a region having a slow cooling rate, a grain boundary 134b may be formed in the region having the slow cooling rate.

Figure 7:
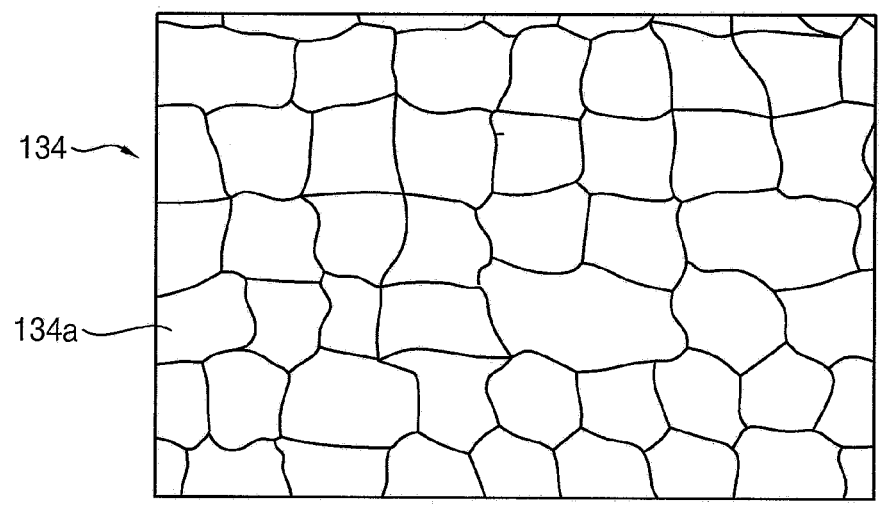
FIG. 7 is a plan view of an exemplary embodiment of a crystallized polycrystalline silicon layer constructed according to the principles of the invention.

FIG. 7 is a plan view of an exemplary embodiment of a crystallized polycrystalline silicon layer constructed according to the principles of the invention.

Referring to FIGS. 6 and 7, a plurality of grains 134a may be formed in the polycrystalline silicon layer 134. The grains 134a may be randomly arranged in a plan view. In an exemplary embodiment, the size of each grain 134a may be in a range of about 150 nm to about 200 nm.

A protrusion 134c may be formed at the grain boundary 134b on a surface of the polycrystalline silicon layer 134 in which the crystallization process is performed. The amorphous silicon layer 132 melted by the laser beam 240 may be re-crystallized around the grain 134a, so that the protrusion 134c may be formed at the grain boundary 134b.

The protrusion 134c may project upward from the surface of the polycrystalline silicon layer 134, and may have a sharp-pointed tip. The protrusion 134c may have a thickness (depth) TH corresponding to the distance from the surface of the polycrystalline silicon layer 134 to the end of the protrusion 134c.

The root-mean-square (RMS) value of a surface roughness of the polycrystalline silicon layer 134 may be about 4 nm or less. For example, an RMS value of thicknesses of the protrusions 134c formed on the surface of the polycrystalline silicon layer 134 may be about 4 nm or less.

In the illustrated embodiment, a cleaning process using the hydrofluoric acid 210 and a rinsing process using the hydrogenated deionized water 220 may be performed before the crystallization process. Therefore, the thickness TH of the protrusion 134c formed on the surface of the polycrystalline silicon layer 134 may decrease, and the polycrystalline silicon layer 134 may be formed with a relatively low surface roughness.

Hereinbefore, the cleaning process, the rinsing process, and the crystallization process for forming the polycrystalline silicon layer 134 are described. However, it is possible to add processes for forming the polycrystalline silicon layer 134 in addition to the above processes or omit some of the above processes. It is also possible that the above processes are performed a plurality of times. For example, the crystallizing process may be performed two or more times.

Hereinafter, a thin film transistor substrate and a method of manufacturing the thin film transistor substrate will be described with reference to FIGS. 8 to 15.

Figure 8:
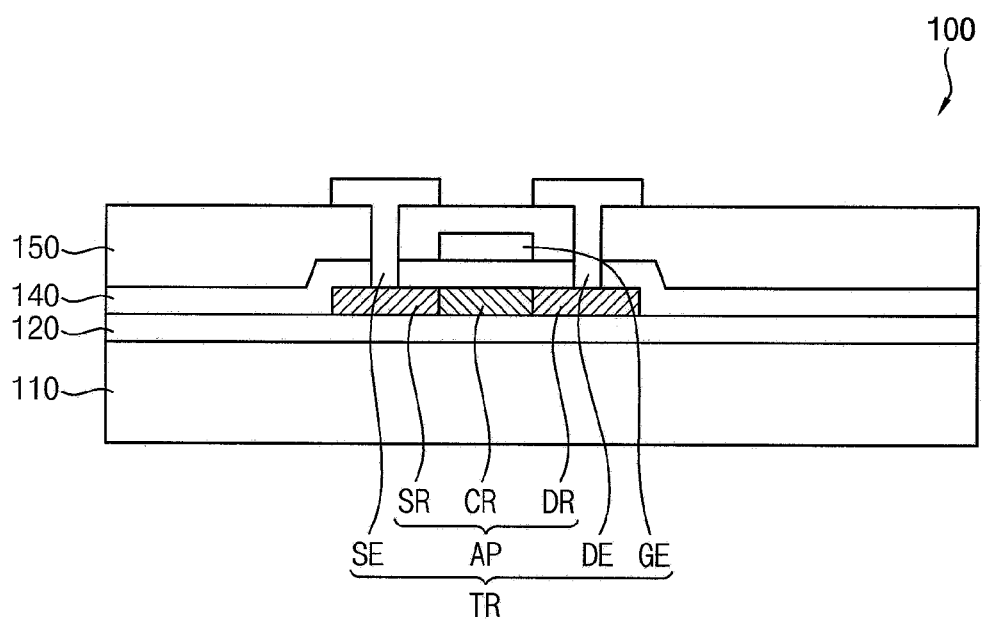
FIG. 8 is a cross-sectional view of a thin film transistor substrate constructed according to the principles of the invention.

FIG. 8 is a cross-sectional view of a thin film transistor substrate constructed according to the principles of the invention.

Referring to FIG. 8, a thin film transistor substrate 100 according to an exemplary embodiment may include a substrate 110 and a thin film transistor TR disposed on the substrate 110. The thin film transistor TR may include an active pattern AP, a gate insulation layer 140, a gate electrode GE, a source electrode SE, and a drain electrode DE which are sequentially stacked. The thin film transistor TR may perform a switching operation of flowing a current through the active pattern AP based on a signal applied to the gate electrode GE.

The thin film transistor TR may have a top gate structure in which the gate electrode GE is positioned above the active pattern AP. However, the exemplary embodiments are not limited thereto, and the thin film transistor TR may have a bottom gate structure in which the gate electrode is positioned below the active pattern AP.

FIGS. 9, 10, 11, 12, 13, 14, and 15 are cross-sectional views illustrating a method of manufacturing the thin film transistor substrate in FIG. 8. Hereinafter, descriptions on elements of a method of manufacturing a thin film transistor substrate according to an exemplary embodiment, which are substantially the same as or similar to those of the method of manufacturing the polycrystalline silicon layer according to the exemplary embodiment, may not be repeated to avoid redundancy.

Figure 9:
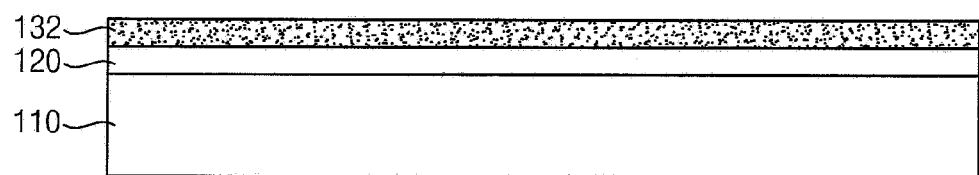
FIGS. 9, 10, 11, 12, 13, 14, and 15 are cross-sectional views illustrating a method of manufacturing the thin film transistor substrate of FIG. 8.

Referring to FIG. 9, an amorphous silicon layer 132 may be formed on a substrate 110.

The substrate 110 may be an insulating substrate including glass, quartz, ceramic, etc. In an exemplary embodiment, the substrate 110 may be an insulating flexible substrate including plastic such as PET, PEN, PEEK, PC, polyarylate, PES, PI, etc. For example, a barrier layer that includes silicon oxide, silicon nitride, amorphous silicon, etc. may be additionally formed on the substrate 110.

A buffer layer 120 may be formed on the substrate 110. The buffer layer 120 may provide a planarized surface above the substrate 110. The buffer layer 120 may prevent impurities from permeating above the substrate 110 through the substrate 110.

The amorphous silicon layer 132 may be formed on the buffer layer 120. The amorphous silicon layer 132 may be formed by methods such as LPCVD, APCVD, PECVD, sputtering, vacuum evaporation, etc. A natural oxide layer may be formed on the amorphous silicon layer 132.

The amorphous silicon layer 132 may be cleaned using hydrofluoric acid. For example, the hydrofluoric acid may include hydrogen fluoride in an amount of about 0.5%. The amorphous silicon layer 132 may be cleaned by the hydrofluoric acid to remove the natural oxide layer formed on the amorphous silicon layer 132. In an exemplary embodiment, the amorphous silicon layer 132 may be cleaned for about 40 seconds to about 54 seconds.

The amorphous silicon layer 132 may be rinsed using hydrogenated deionized water. For example, the hydrogen concentration of the hydrogenated deionized water may be about 1.0 ppm. The hydrofluoric acid that remains on the amorphous silicon layer 132 may be removed by rinsing the amorphous silicon layer 132 with the hydrogenated deionized water.

Figure 10:
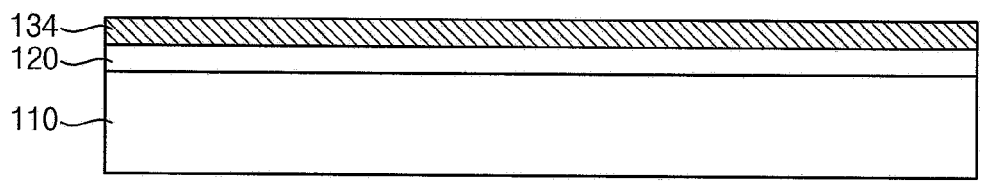

Referring to FIG. 10, the amorphous silicon layer 132 may be crystallized to form a polycrystalline silicon layer 134.

The polycrystalline silicon layer 134 may be formed by irradiating the amorphous silicon layer 132 with a laser beam. A laser may intermittently generate the laser beam to irradiate the amorphous silicon layer 132.

The laser may irradiate the amorphous silicon layer 132 with the laser beam having an energy density in a range of about 450 mJ/cm2 to about 500 mJ/cm2. In an exemplary embodiment, the width of the laser beam may be about 480 μm, and the scan pitch of the laser beam may be in a range of about 9 μm to about 30 μm.

When the laser beam is irradiated on the amorphous silicon layer 132 in a solid state, the amorphous silicon layer 132 may absorb heat and change into a liquid state. Then, the amorphous silicon layer 132 may release the heat and change into the solid state again. In this case, a crystal may grow from a crystal seed, and a grain may be formed. When there is a difference in cooling rate in the amorphous silicon layer 132 in the course of changing from the liquid state to the solid state, since the grain grows from a region having a high cooling rate toward a region having a slow cooling rate, a grain boundary may be formed in the region having the slow cooling rate.

A plurality of grains may be formed in the polycrystalline silicon layer 134. The grains may be randomly arranged in a plan view. In an exemplary embodiment, the size of the grain may in a range of about 150 nm to about 200 nm.

A protrusion may be formed at the grain boundary on a surface of the polycrystalline silicon layer 134 in which the crystallization process is performed. The protrusion may project upward from the surface of the polycrystalline silicon layer 134, and may have a sharp-pointed tip. The protrusion may have a thickness (depth) corresponding to a distance from the surface of the polycrystalline silicon layer 134 to the end of the protrusion.

The RMS value of a surface roughness of the polycrystalline silicon layer 134 may be about 4 nm or less. For example, an RMS value of thicknesses of the protrusions formed on the surface of the polycrystalline silicon layer 134 may be about 4 nm or less.

Figure 11:
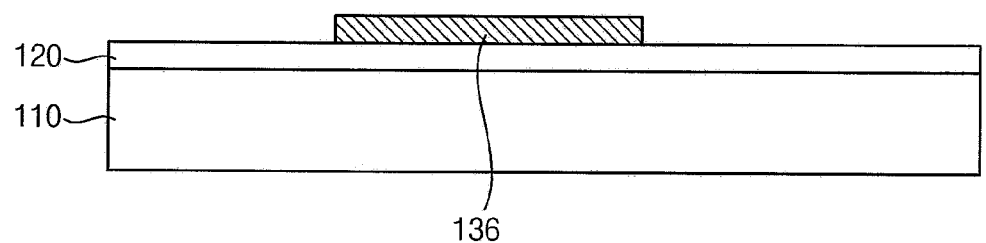

Referring to FIG. 11, the polycrystalline silicon layer 134 may be etched to form the polycrystalline silicon pattern 136. The polycrystalline silicon layer 134 may be etched by photolithography. For example, a photoresist pattern may be formed on the polycrystalline silicon layer 134 using an exposing process and a developing process, and the polycrystalline silicon layer 134 may be etched using the photoresist pattern as an etch-stopper.

Figure 12:
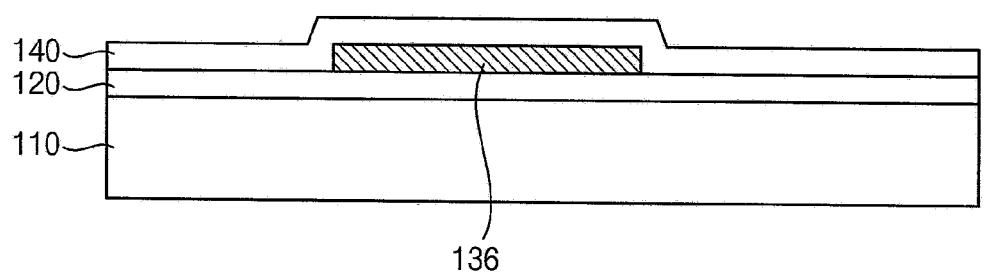

Referring to FIG. 12, a gate insulation layer 140 may be formed on the polycrystalline silicon pattern 136. The gate insulation layer 140 may be disposed on the buffer layer 120, and may cover the polycrystalline silicon pattern 136. The gate insulation layer 140 may insulate a gate electrode GE from the polycrystalline silicon pattern 136. For example, the gate insulation layer 140 may be formed of silicon oxide, silicon nitride, etc.

In an exemplary embodiment, the polycrystalline silicon pattern 136 having an RMS value of a surface roughness of about 4 nm or less may be formed so that the polycrystalline silicon pattern 136 may have a relatively low surface roughness. Accordingly, the affect upon the gate insulation layer 140 formed on the polycrystalline silicon pattern 136 by the protrusion formed on the surface of the polycrystalline silicon pattern 136 may be minimized, and the gate insulation layer 140 may be relatively thin. For example, the thickness (depth) of the gate insulation layer 140 may be in a range of about 30 nm to about 200 nm.

Figure 13:
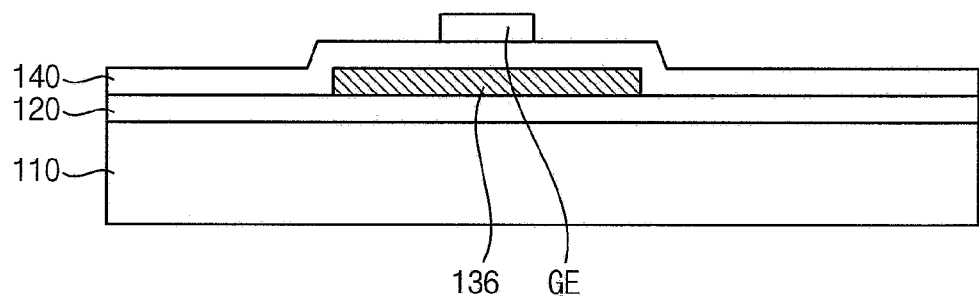

Referring to FIG. 13, the gate electrode GE may be formed on the gate insulation layer 140.

The gate electrode GE may overlap the polycrystalline silicon pattern 136. The gate electrode GE may include gold (Au), silver (Ag), aluminum (Al), copper (Cu), nickel (Ni), platinum (Pt), magnesium (Mg), chromium (Cr), tungsten (W), molybdenum (Mo), titanium (Ti), or an alloy thereof, and may have a single-layer structure or a multilayer structure including different metal layers. For example, the gate electrode GE may include a triple layer of Mo, Al and Mo, a double layer of Cu and Ti, or the like.

For example, a first metal layer and a photoresist pattern that overlaps the polycrystalline silicon pattern 136 may be formed on the gate insulation layer 140. Then, the first metal layer may be etched using the photoresist pattern to form the gate electrode GE.

Figure 14:
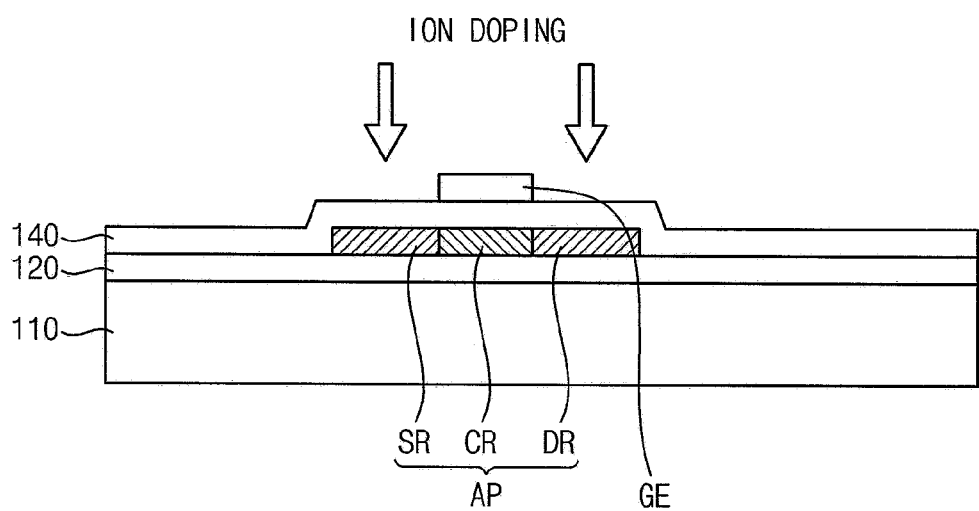

Referring to FIG. 14, ions may be injected into portions of the polycrystalline silicon pattern 136 to form an active pattern AP.

The polycrystalline silicon pattern 136 may be partially doped with an ion injection process so that the active pattern AP including a source region SR, a channel region CR, and a drain region DR may be formed. The ions may be n-type impurities or p-type impurities.

The ions may not be doped and remain in a portion of the polycrystalline silicon pattern 136 which overlaps the gate electrode GE thereby forming the channel region CR. Portions of the polycrystalline silicon pattern 136 which are doped with ions may have increased conductivity and may have conductive properties, so that the source region SR and the drain region DR may be formed. The channel region CR may be formed between the source region SR and the drain region DR.

In an exemplary embodiment, a low concentration doping region may be respectively formed between the channel region CR and the source region SR and between the channel region CR and the drain region DR by doping impurities with a lower concentration than that of the ion injection process. The low concentration doping region may serve as a buffer in the active pattern AP so that electrical characteristics of a thin film transistor may be improved.

Figure 15:
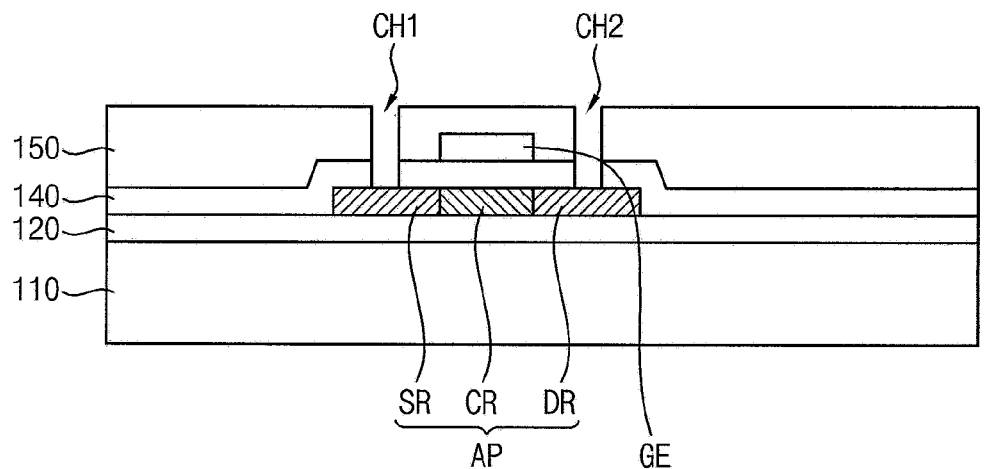

Referring to FIG. 15, an insulation interlayer 150 may be formed on the gate electrode GE. The insulation interlayer 150 may be disposed on the gate insulation layer 140, and may cover the gate electrode GE. The insulation interlayer 150 may insulate a source electrode SE and a drain electrode DE from the gate electrode GE.

The insulation interlayer 150 may include an inorganic insulation layer, an organic insulation layer, or a combination thereof. For example, the insulation interlayer 150 may include silicon oxide, silicon nitride, silicon carbide, or a combination thereof, and may also include insulating metal oxide such as aluminum oxide, tantalum oxide, hafnium oxide, zirconium oxide, titanium oxide, etc. When the insulation interlayer 150 includes the organic insulation layer, the insulation interlayer 150 may include polyimide, polyamide, acryl resin, phenol resin, benzo cyclobutene (BCB), etc.

Then, the insulation interlayer 150 and the gate insulation layer 140 may be partially etched to form a first contact hole CH1 and a second contact hole CH2 respectively exposing the source region SR and the drain region DR.

Referring to FIG. 8, the source electrode SE and the drain electrode DE respectively electrically connected to the source region SR and the drain region DR of the active pattern AP may be formed on the insulation interlayer 150.

For example, a second metal layer may be formed on the insulation interlayer 150 and patterned to form the source electrode SE being in contact with the source region SR and the drain electrode DE being in contact with the drain region DR. For example, each of the source electrode SE and the drain electrode DE may include Au, Ag, Al, Cu, Ni, Pt, Mg, Cr, W, Mo, Ti, or an alloy thereof, and may have a single-layer structure or a multilayer structure including different metal layers. For example, each of the source electrode SE and the drain electrode DE may include a triple layer of Mo, Al and Mo, a double layer of Cu and Ti, or the like.

In the illustrated embodiment, a cleaning process using the hydrofluoric acid and a rinsing process using the hydrogenated deionized water may be performed before the crystallization process so that the thin film transistor TR may be formed with improved characteristics such as a threshold voltage, hysteresis, etc.

Hereinafter, a display device and a method of manufacturing the display device will be described with reference to FIGS. 16 to 19.

Figure 16:
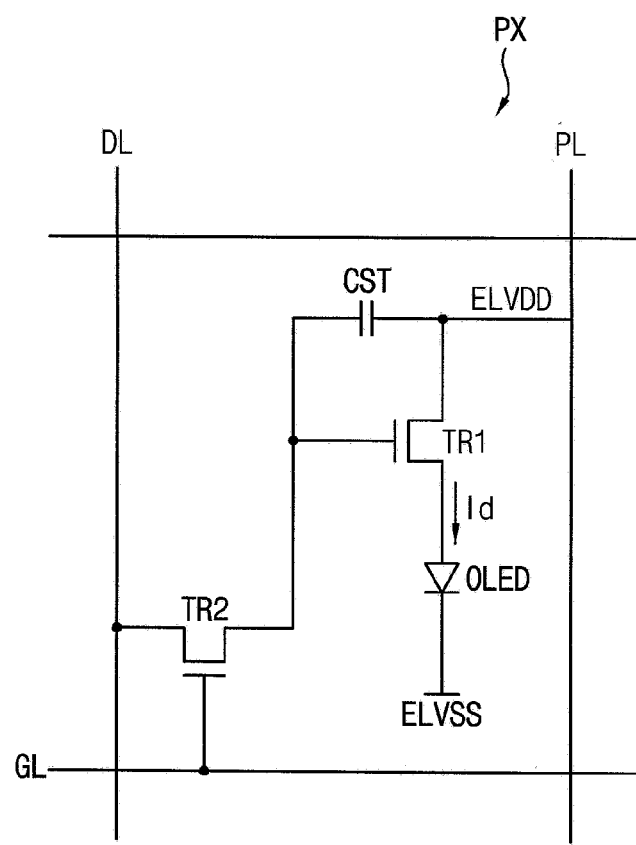
FIG. 16 is an equivalent circuit diagram illustrating one representative pixel of the display device according to exemplary embodiments.

Referring to FIG. 16, a display device according to an exemplary embodiment may include signal lines and a plurality of pixels PX connected to the signal lines and arranged as a substantial matrix form.

The signal lines may include gate lines GL for transmitting gate signals (or scan signals), data lines DL for transmitting data voltages, and driving voltage lines PL for transmitting driving voltages ELVDD. The gate lines GL may extend along a substantial row direction. The data lines DL and the driving voltage lines PL may cross the gate lines GL, and may extend along a substantial column direction. Each pixel PX may include a driving transistor TR1, a switching transistor TR2, a storage capacitor CST, and an organic light emitting diode OLED.

The driving transistor TR1 may include a control terminal connected to the switching transistor TR2, an input terminal connected to the driving voltage line PL, and an output terminal connected to the organic light emitting diode OLED. The driving transistor TR1 may transmit an output current Id whose magnitude varies depending on the voltage between the control terminal and the output terminal of the driving transistor TR1 to the organic light emitting diode OLED.

The switching transistor TR2 may include a control terminal connected to the gate line GL, an input terminal connected to the data line DL, and an output terminal connected to the driving transistor TR1. The switching transistor TR2 may transmit the data voltage applied to the data line DL in response to the gate signal applied to the gate line GL to the driving transistor TR1.

The storage capacitor CST may connect the control terminal and the input terminal of the driving transistor TR1. The storage capacitor CST may store the data voltage applied to the control terminal of the driving transistor TR1, and may maintain the data voltage after the switching transistor TR2 is turned off.

The organic light emitting diode OLED may include an anode connected to the output terminal of the driving transistor TR1 and a cathode connected to a common voltage ELVSS. The organic light emitting diode OLED may emit light having different luminance depending on the output current Id of the driving transistor TR1 to display an image.

In an exemplary embodiment, each pixel PX may include two thin film transistors TR1 and TR2 and one capacitor CST, however, the exemplary embodiments are not limited thereto. Fro example, in other exemplary embodiments, each pixel PX may include three or more thin film transistors and two or more capacitors.

Figure 17:
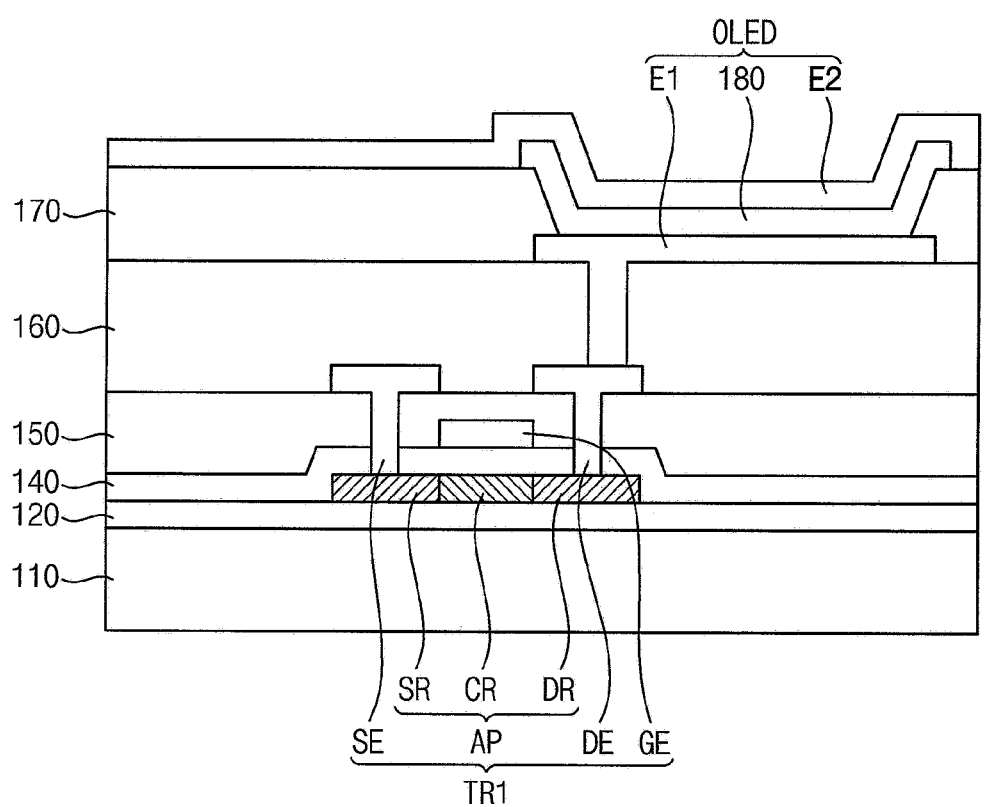
FIG. 17 is a cross-sectional view illustrating a display device constructed according to the principles of the invention.

FIG. 17 is a cross-sectional view illustrating a display device according to an exemplary embodiment.

Referring to FIG. 17, a display device according to an exemplary embodiment may include a substrate 110, a thin film transistor disposed on the substrate 110, and a display element disposed on the thin film transistor. In an exemplary embodiment, the display device may include an organic light emitting diode as the display element. However, the illustrated embodiment is not limited thereto, and in other exemplary embodiments, the display device may include a liquid crystal element, an electrophoresis element, an electrowetting element, etc.

The thin film transistor TR1 and the organic light emitting diode OLED shown in FIG. 17 may correspond to the driving transistor TR1 and the organic light emitting diode OLED shown in FIG. 16, respectively. The display device according to the exemplary embodiment may include the thin film transistor substrate 100 according to the exemplary embodiment illustrated in FIG. 8.

The organic light emitting diode OLED may include a first electrode E1, an emission layer 180, and a second electrode E2, which are sequentially stacked. The organic light emitting diode OLED may emit light based on a driving current receiving from the thin film transistor TR1 to display an image.

Figure 18:
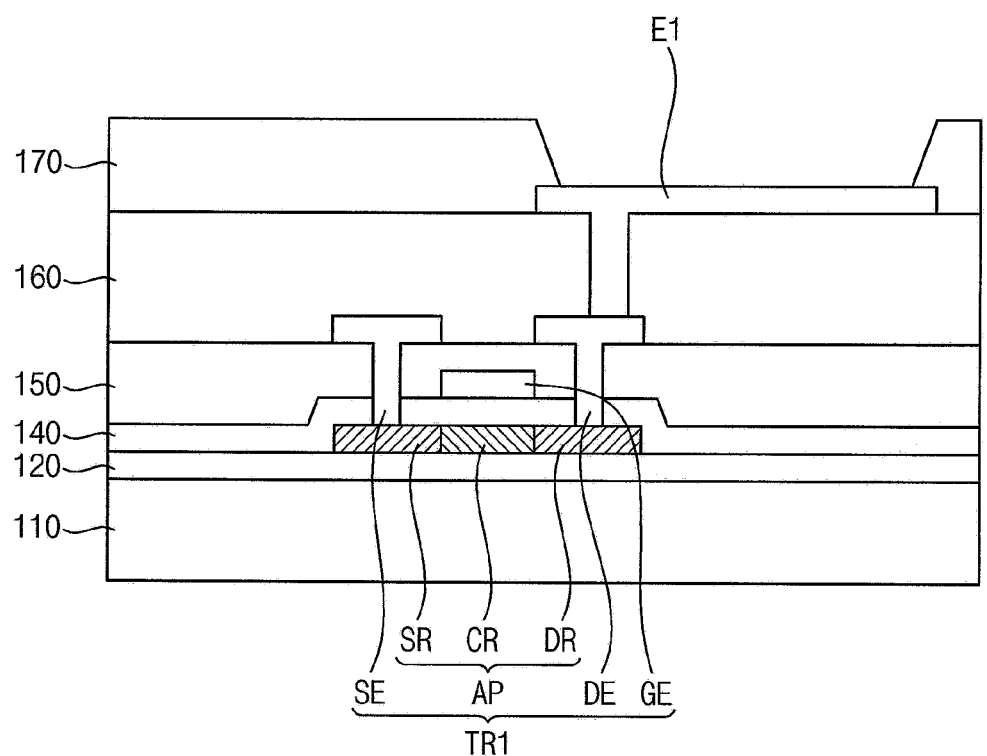
FIGS. 18 and 19 are cross-sectional views illustrating an exemplary method of manufacturing the display device in FIG. 17.
Figure 19:
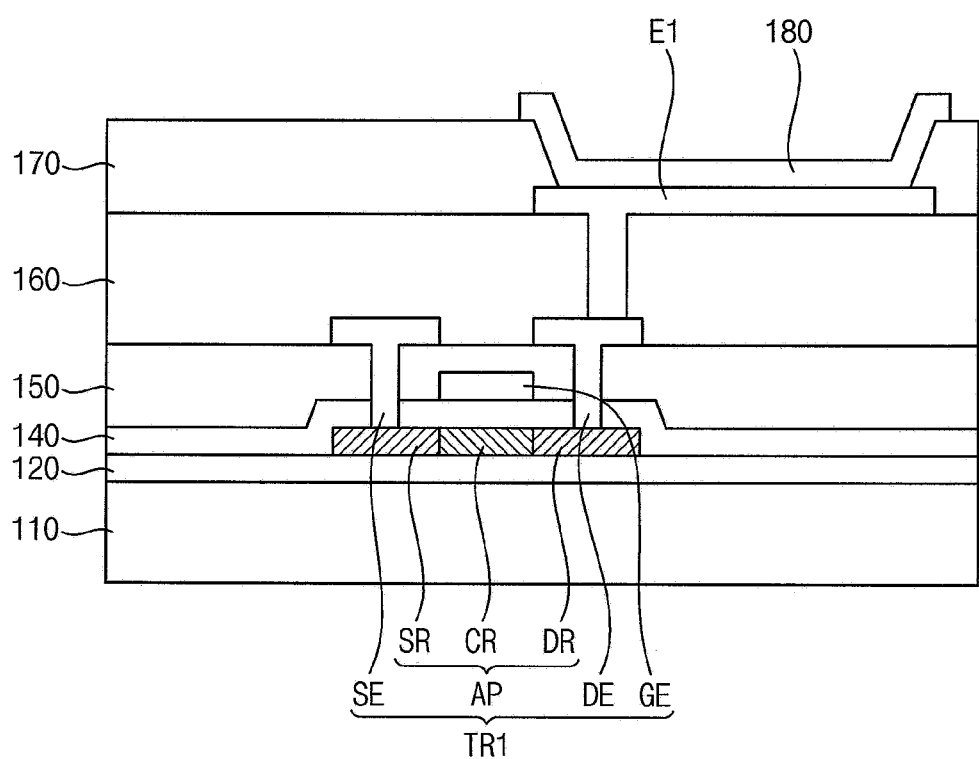

FIGS. 18 and 19 are cross-sectional views illustrating an exemplary method of manufacturing the display device in FIG. 17. Hereinafter, descriptions on elements of a method of manufacturing a display device according to an exemplary embodiment, which are substantially the same as or similar to those of the method of manufacturing the thin film transistor substrate according to the exemplary embodiment, may not be repeated to avoid redundancy.

Referring to FIG. 18, a first electrode E1 may be formed on a thin film transistor TR1.

First, a planarization layer (or a passivation layer) 160 may be formed on a source electrode SE and a drain electrode DE. The planarization layer 160 may be disposed on an insulation interlayer 150, and may cover the source electrode SE and the drain electrode DE.

The planarization layer 160 may include an inorganic insulation layer, an organic insulation layer, or a combination thereof. For example, the planarization layer 160 may have a single-layer structure or a multilayer structure including silicon nitride or silicon oxide. When the planarization layer 160 includes the organic insulation layer, the planarization layer 160 may include polyimide, polyamide, acrylic resin, phenol resin, BCB, etc.

Then, the planarization layer 160 may be patterned to form a contact hole that exposes the drain electrode DE.

Then, the first electrode E1 may be formed on the planarization layer 160. The first electrode E1 may be connected to the drain electrode DE. For example, a third metal layer may be formed on the planarization layer 160 and patterned to form the first electrode E1 that is in contact with the drain electrode DE.

The first electrode E1 may be a pixel electrode of the display device. The first electrode E1 may be formed as a transmitting electrode or a reflective electrode depending on an emission type of the display device. When the first electrode E1 is formed as the transmitting electrode, the first electrode E1 may include indium tin oxide (ITO), indium zinc oxide (IZO), zinc tin oxide (ZTO), indium oxide (In2O3), zinc oxide (ZnO), tin oxide (SnO2), etc. When the first electrode E1 is formed as the reflective electrode, the first electrode E1 may include Au, Ag, Al, Cu, Ni, Pt, Mg, Cr, W, Mo, Ti, etc., and may have a multilayer structure including the materials used in the transmitting electrode.

Then, a pixel defining layer 170 may be formed on the planarization layer 160. The pixel defining layer 170 may have an opening portion that exposes at least a portion of the first electrode E1. For example, the pixel defining layer 170 may include an organic insulation material.

Referring to FIG. 19, an emission layer 180 may be formed on the first electrode E1.

The emission layer 180 may be formed on an upper surface of the first electrode E1 exposed by the opening portion of the pixel defining layer 170. For example, the emission layer 180 may be formed by methods such as screen printing, inkjet printing, evaporation, etc.

The emission layer 180 may include a low molecular weight polymer or a high molecular weight polymer. For example, the emission layer 180 may include copper phthalocyanine, N,N'-diphenylbenzidine, tris-(8-gydroxyquinoline)aluminum, etc., as the low molecular weight polymer. The emission layer 180 may include poly(3,4-ethylenedioxythiophene), polyaniline, poly-phenylenevinylene, polyfluorene, etc., as the high molecular weight polymer.

In an exemplary embodiment, the emission layer 180 may emit red light, green light, or blue light. In another exemplary embodiment, when the emission layer 180 emit white light, the emission layer 180 may have a multilayer structure including a red emission layer, a green emission layer, and a blue emission layer, or a single-layer structure including a red emission material, a green emission material, and a blue emission material.

In an exemplary embodiment, a hole injection layer and/or a hole transport layer may be further formed between the first electrode E1 and the emission layer 180, or an electron transport layer and/or an electron injection layer may be further formed on the emission layer 180.

Referring to FIG. 17, a second electrode E2 may be formed on the emission layer 180.

The second electrode E2 may be a common electrode of the display device. The second electrode E2 may be formed as a transmitting electrode or a reflective electrode depending on an emission type of the display device. For example, when the second electrode E2 is formed as the transmitting electrode, the second electrode E2 may include lithium (Li), calcium (Ca), lithium fluoride (LiF), aluminum (Al), magnesium (Mg), or a combination thereof.

The display device may be a top emission type in which light is emitted toward the second electrode E2. However, the exemplary embodiments are not limited thereto, and the display device may also be a bottom emission type.

The display device according to the exemplary embodiments may be applied to a display device included in a computer, a notebook, a mobile phone, a smartphone, a smart pad, a PMP, a PDA, an MP3 player, or the like.

Although certain exemplary embodiments and implementations for manufacturing the polycrystalline silicon layers, the thin film transistor substrates and the methods of manufacturing the same, and the display devices and the methods of manufacturing the same have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
a substrate;
a thin film transistor disposed on the substrate; and
a display element disposed on the thin film transistor,
wherein:
the thin film transistor comprises:
an active pattern disposed on the substrate and including a plurality of grains separated by grain boundaries, and having protrusions formed at the grain boundaries, the active pattern having a low surface roughness with a root-mean-square (RMS) value of about 4 nm or less, wherein the thin film transistor has a substantially uniform threshold voltage;
a gate insulation layer disposed on the active pattern, the gate insulation layer having a thickness in a range of about 30 nm to about 200 nm, and being protected from damage by the low surface roughness of the active pattern; and
a gate electrode disposed on the gate insulation layer.

2. The display device of claim 1, wherein:
each of the protrusions is formed on a surface of the active pattern, and
the protrusion has a sharp-pointed tip.

3. The display device of claim 1, wherein each of the grains has a size in a range of about 150 nm to about 200 nm or the active pattern comprises randomly arranged grains.

4. The display device of claim 1, further comprising a buffer layer disposed between the substrate and the active pattern.

5. The display device of claim 1, wherein the active pattern comprises a source region, a drain region, and a channel region formed between the source region and the drain region.

6. The display device of claim 5, wherein the gate electrode overlaps the channel region of the active pattern.

7. The display device of claim 5, wherein the thin film transistor further comprises a source electrode and a drain electrode disposed on the gate electrode, the source electrode and the drain electrode being respectively electrically connected to the source region and the drain region of the active pattern.

8. The display device of claim 1, wherein the display element comprises:
a first electrode electrically connected to the thin film transistor;
an emission layer disposed on the first electrode; and
a second electrode disposed on the emission layer.

* * * * *